(12) United States Patent
Watanabe et al.

(10) Patent No.: US 8,518,809 B2
(45) Date of Patent: Aug. 27, 2013

(54) MANUFACTURING METHOD OF SILICON CARBIDE SINGLE CRYSTAL

(75) Inventors: Hiroki Watanabe, Tokai (JP); Yasuo Kitou, Okazaki (JP); Yasushi Furukawa, Obu (JP); Kensaku Yamamoto, Chiryu (JP); Hidefumi Takaya, Toyota (JP); Masahiro Sugimoto, Toyota (JP); Yukihiko Watanabe, Nagoya (JP); Narumasa Soejima, Seto (JP); Tsuyoshi Ishikawa, Nisshin (JP)

(73) Assignee: DENSO CORPORATION, Kariya (JP)

( * ) Notice: Subject to any disclaimer, the term of this patent is extended or adjusted under 35 U.S.C. 154(b) by 97 days.

(21) Appl. No.: 13/308,721

(22) Filed: Dec. 1, 2011

(65) Prior Publication Data

US 2012/0142173 A1    Jun. 7, 2012

(30) Foreign Application Priority Data

Dec. 3, 2010  (JP) ................ 2010-270295

(51) Int. Cl.
*H01L 21/20*    (2006.01)
(52) U.S. Cl.
USPC ......... 438/504; 438/505; 117/95; 257/E21.09
(58) Field of Classification Search
USPC ................ 438/504, 505, 931; 117/95
See application file for complete search history.

(56) References Cited

U.S. PATENT DOCUMENTS

| | | | | |
|---|---|---|---|---|
| 2002/0019117 A1* | 2/2002 | Nagasawa | ............... | 438/505 |
| 2004/0266057 A1* | 12/2004 | Nagasawa | ............... | 438/105 |
| 2005/0064723 A1 | 3/2005 | Sumakeris | | |
| 2008/0318359 A1* | 12/2008 | Yonezawa et al. | ............ | 438/105 |
| 2009/0085044 A1* | 4/2009 | Ohno et al. | ................ | 257/77 |
| 2009/0317983 A1* | 12/2009 | Miyanagi et al. | ............. | 438/795 |
| 2011/0156054 A1* | 6/2011 | Takeuchi et al. | ................ | 257/77 |
| 2011/0278596 A1* | 11/2011 | Aigo et al. | ..................... | 257/77 |

FOREIGN PATENT DOCUMENTS

| | | |
|---|---|---|
| JP | A-2008-24554 | 2/2008 |
| JP | A-2008-27969 | 2/2008 |

OTHER PUBLICATIONS

Takashi Tsuji, *Proceedings of the 4th Individual Discussion of the SiC and Related Wide Bandgap Semiconductors of Japan Society of Applied Physics*, Jul. 31, 2009, pp. 74-80 (Discussed on p. 1 of the specification).

Takuma Suzuki, *Proceedings of the 4th Individual Discussion of the SiC and Related Wide Bandgap Semiconductors of Japan Society of Applied Physics*, Jul. 31, 2009, pp. 50-54 (Discussed on p. 1 of the specification).

Senzaki et al., "Evaluation of 4H-SiC Thermal Oxide Reliability Using Area-Scaling Method" *Japanese Journal of Applied Physics*, 48 (8, Pt. 1) 2009, pp. 081404-1-081404-4 (Discussed on p. 1 of the specification).

* cited by examiner

*Primary Examiner* — Alexander Ghyka
(74) *Attorney, Agent, or Firm* — Posz Law Group, PLC

(57) ABSTRACT

A manufacturing method of an SiC single crystal includes preparing an SiC substrate, implanting ions into a surface portion of the SiC substrate to form an ion implantation layer, activating the ions implanted into the surface portion of the SiC substrate by annealing, chemically etching the surface portion of the SiC substrate to form an etch pit that is caused by a threading screw dislocation included in the SiC substrate and performing an epitaxial growth of SiC to form an SiC growth layer on a surface of the SiC substrate including an inner wall of the etch pit in such a manner that portions of the SiC growth layer grown on the inner wall of the etch pit join with each other.

18 Claims, 7 Drawing Sheets

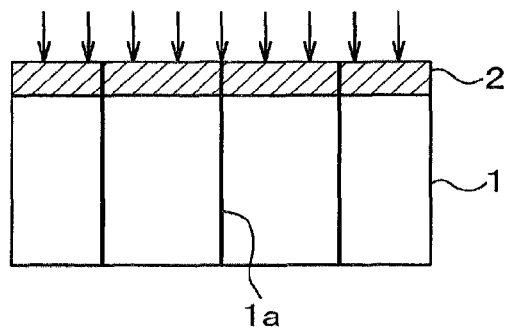
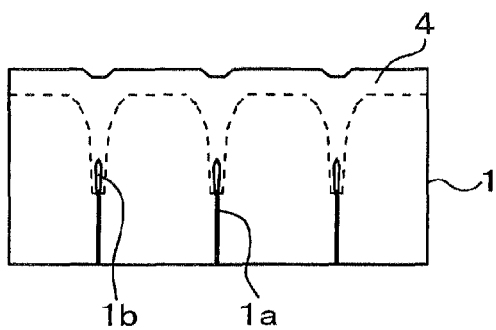
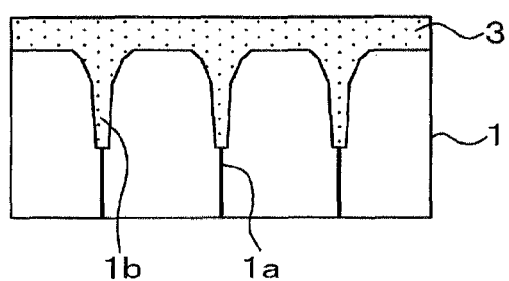
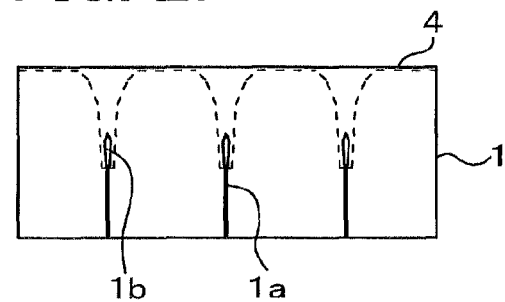
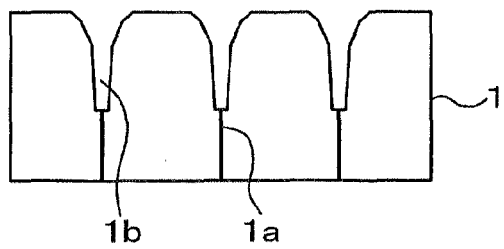
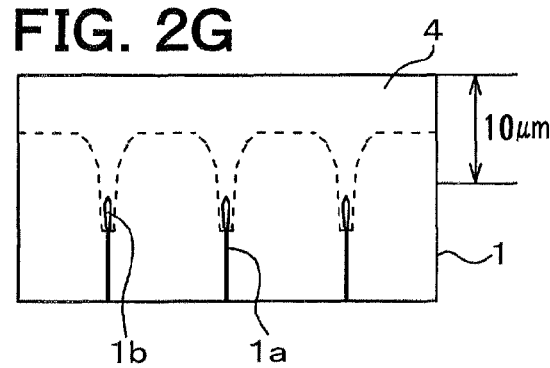
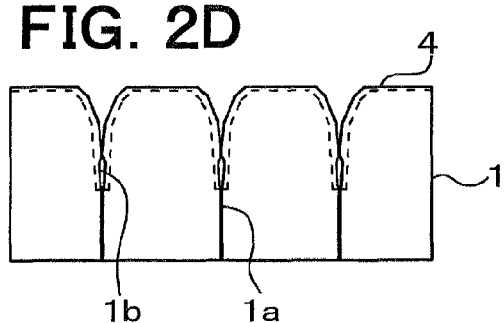

J1

2μm 0.2μm

TSDA

J1

2μm 0.2μm

TSDA

MANUFACTURING METHOD OF SILICON CARBIDE SINGLE CRYSTAL

CROSS REFERENCE TO RELATED APPLICATION

This application is based on Japanese Patent Application No. 2010-270295 filed on Dec. 3, 2010, the disclosure of which is incorporated herein by reference.

TECHNICAL FIELD

The present invention relates to a manufacturing method of a silicon carbide (hereafter referred to as SiC) single crystal.

BACKGROUND

SiC is expected for a material that can be applied to high-voltage devices. However, SiC has crystal defects such as dislocations and stacking faults, which are generated during the crystal growth. Specifically, it is reported that threading screw dislocations cause a substantial distortion in a crystal arrangement, and largely affect characteristics of SiC devices. For example, the threading screw dislocations affect leakage in a p-n diode as disclosed in Takashi Tsuji: the Proceedings of the 4th Individual Discussion of the SiC and Related Wide Bandgap Semiconductors of the Japan Society of Applied Physics, Jul. 31, 2009, page 74. The threading screw dislocations also affect drain leakage in a metal oxide semiconductor field effect transistor (MOSFET) and oxide-layer leakage in a MOSFET as disclosed in Takuma Suzuki: the Proceedings of the 4th Individual Discussion of the SiC and Related Wide Bandgap Semiconductors of the Japan Society of Applied Physics Jul. 31, 2009, Page 50. Additionally, basal surface dislocations affect leakage of a MOS capacitor as disclosed in J. Senzaki et al.: J. J. Appl. Phys., 48 (8, Pt. 1) (2009). Therefore, various methods for reducing crystal defects are disclosed.

For example, methods for reducing dislocations with an etch-pit method that exposes dislocations are disclosed. For the basal dislocations, JP-T-2007-506289 (corresponding to US 2005/0064723 A1, hereafter referred to as a patent document 1) discloses a method in which the basal dislocations are converted into threading dislocations by performing an epitaxial growth on a surface of an etch pit. However, the method disclosed in the patent document 1, can not reduce the threading dislocations. For the threading dislocations, JP-A-2008-24554 (hereafter referred to as a patent document 2) discloses a method in which SiC is epitaxially grown after filling the etch pit with a material other than SiC and planarizing a surface of the filled etch pit. However, the method disclosed in the patent document 2 may generate polymorphous crystals and new dislocations.

Further, for the threading dislocations, JP-A-2008-027969 (hereafter referred to as a patent document 3) discloses a method for restricting a diffusion of the threading dislocations. Specifically, an n-type epitaxial layer is formed on a p-type epitaxial layer. Then the n-type layer and the p-type layer, which have different etching rates to KOH solution, are etched with the KOH solution. Then another n-type layer is grown epitaxially on the n-type layer. Accordingly, the diffusion of the threading dislocations can be restricted.

However, the method disclosed in the patent document 3 requires time to form the n-type layer and the p-type layer stacked in order. Additionally, the method disclosed in the patent document 3 may generate substantial distortions. Further, since threading screw dislocations have a large etching rate compared with an etching rate difference between the p-type layer and the n-type layer, it is difficult to shape the etch pit differently in the p-type layer and the n-type layer.

SUMMARY

In view of the foregoing difficulties, it is an object of the present disclosure to provide a manufacturing method of a silicon carbide single crystal in which a transfer of polymorphous crystals and dislocations is restricted, and threading dislocations are reduced without forming a p-type layer and an n-type layer stacked in order.

According to a first aspect of the present disclosure, a manufacturing method of the silicon carbide single crystal includes preparing a silicon carbide substrate, implanting ions into a surface portion of the silicon carbide substrate to form an ion implantation layer, activating the ions implanted into the surface portion of the silicon carbide substrate by annealing, chemically etching the surface portion of the silicon carbide substrate to form an etch pit that is caused by a threading screw dislocation included in the silicon carbide substrate, and performing an epitaxial growth of silicon carbide to form a silicon carbide growth layer on a surface of the silicon carbide substrate including an inner wall of the etch pit. The epitaxial growth is performed in such a manner that portions of the silicon carbide growth layer grown on the inner wall of the etch pit join with each other.

In the above manufacturing method, the silicon carbide growth layer, which has a surface without threading screw dislocations, can be obtained. Thus, the silicon carbide single crystal, in which the transfer of polymorphous crystals and dislocations is restricted and threading dislocations are reduced without forming the p-type layer and the n-type layer stacked in order, can be manufactured.

The silicon carbide single crystal manufactured with the manufacturing method according to the first aspect can be used to form a silicon carbide semiconductor substrate, and the silicon carbide semiconductor substrate can be used for manufacturing a MOSFET or a diode, in which current flows in a direction perpendicular to the silicon carbide semiconductor substrate.

According to a second aspect of the present disclosure, a manufacturing method of the silicon carbide single crystal includes preparing a silicon carbide substrate, implanting ions into a surface portion of the silicon carbide substrate to form an ion implantation layer, activating the ions implanted into the surface portion of the silicon carbide substrate by annealing, thermally oxidizing the ion implantation layer and a defective portion in the silicon carbide substrate to form a thermal oxidization film, chemically etching the surface portion of the silicon carbide substrate to remove the thermal oxidization film and to form an etch pit that is caused by a threading screw dislocation, and performing an epitaxial growth of silicon carbide to form a silicon carbide growth layer on a surface of the silicon carbide substrate including an inner wall of the etch pit. The defective portion has a destroyed crystallinity due to a threading screw dislocation included in the silicon carbide substrate. The epitaxial growth is performed in such a manner that portions of the silicon carbide growth layer grown on the inner wall of the etch pit join with each other.

In the above manufacturing method, the silicon carbide single crystal, in which the transfer of polymorphous crystals and dislocations is restricted and threading dislocations are reduced without forming the p-type layer and the n-type layer stacked in order, can be manufactured.

The silicon carbide single crystal manufactured with the manufacturing method according to the second aspect can be used to form a silicon carbide semiconductor substrate, and the silicon carbide semiconductor substrate can be used for manufacturing a MOSFET or a diode, in which current flows in a direction perpendicular to the silicon carbide semiconductor substrate.

BRIEF DESCRIPTION OF THE DRAWINGS

The above and other objects, features and advantages of the present disclosure will become more apparent from the following detailed description made with reference to the accompanying drawings. In the drawings:

FIG. 2A to FIG. 2G are cross-sectional diagrams showing manufacturing processes of a manufacturing method of an SiC single crystal according to a second embodiment of the present disclosure;

DETAILED DESCRIPTION

Before describing embodiments of the present disclosure, a study that is performed by the inventors to arrive at the present invention will be described. According to the study by the inventors, in a case where a MOSFET is made from an SiC semiconductor substrate, a dislocation which cause drain leakage of the MOSFET is a threading screw dislocation. Additionally, it is confirmed that a substantially deep etch pit (specific etch pit) is generated at a leakage portion after implanting impurity ions, activating annealing process and a wet etching using KOH solution are performed. The leakage portion corresponds to a portion at which leakage is caused.

Figure 5A:
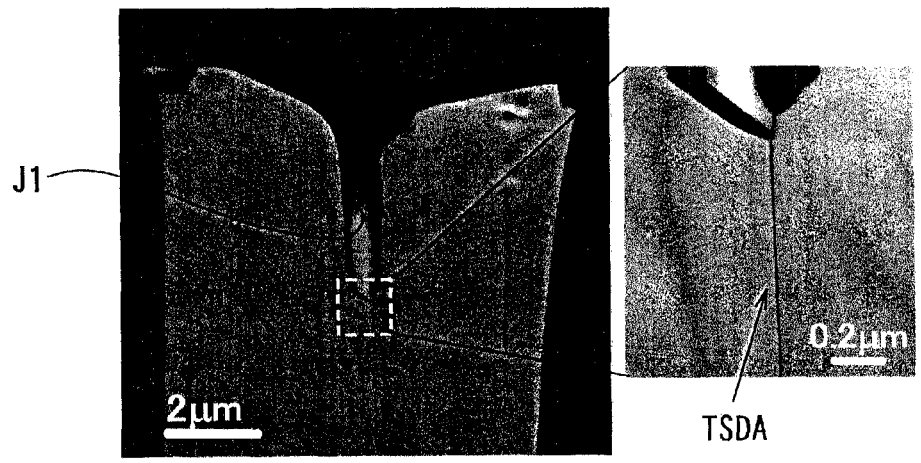
FIG. 5A is a cross-sectional TEM observation image of a specific etch pit that is formed at a portion corresponding to a leakage portion.
Figure 5B:
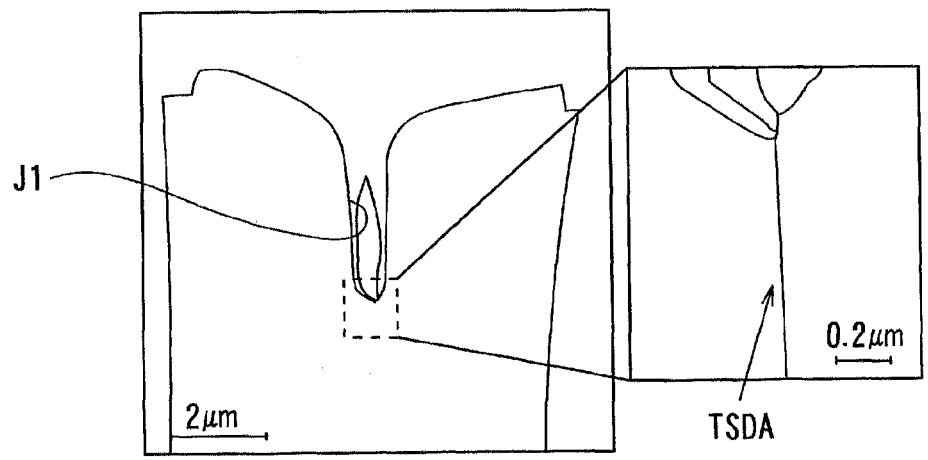
FIG. 5B is an illustrative view of the cross-sectional TEM observation image shown in FIG. 5A.
Figure 5C:
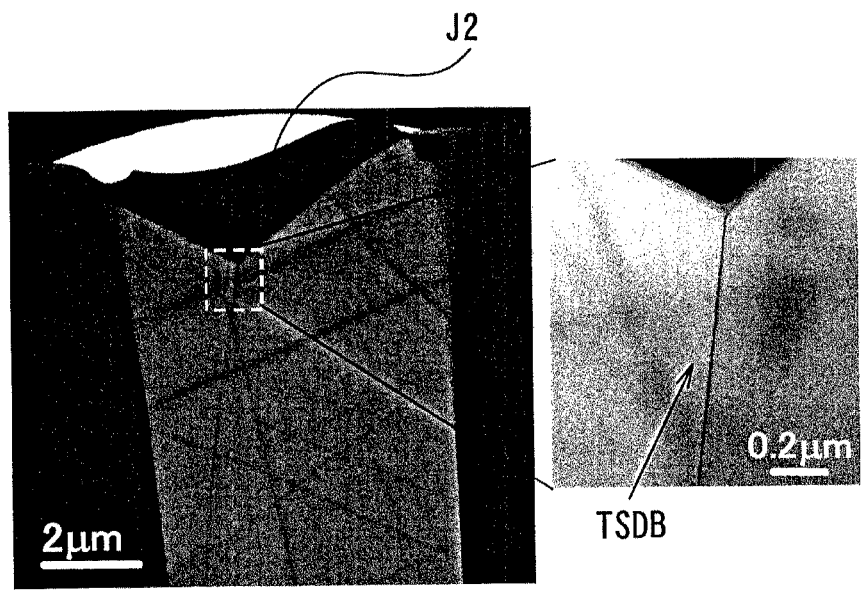
FIG. 5C is a cross-sectional TEM observation image of a normal etch pit that is formed at a portion other than the leakage portion.
Figure 5D:
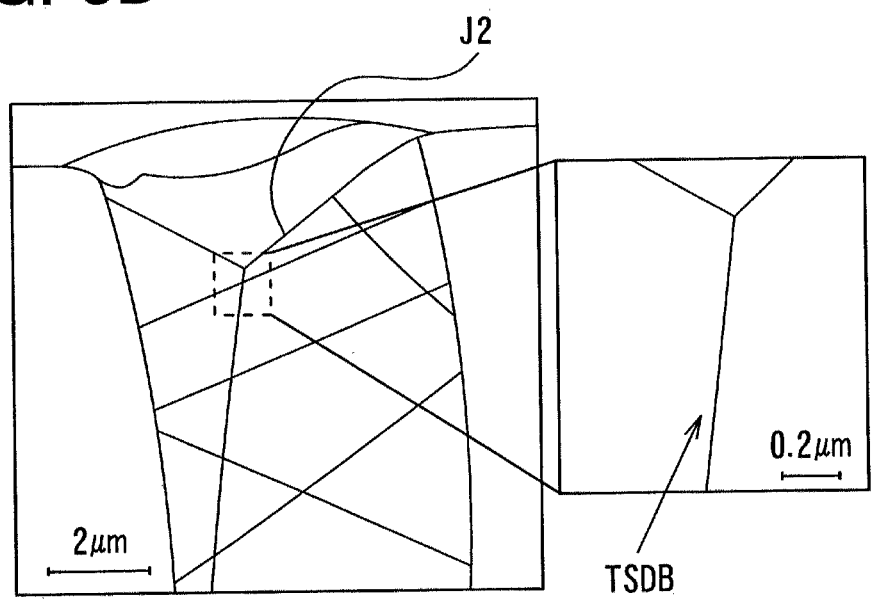
FIG. 5D is an illustrative view of the cross-sectional TEM observation image shown in FIG. 5C.

As shown in FIG. 5A and FIG. 5B, in a leakage portion, an etch pit J1 is caused by a threading screw dislocation A (TSDA) that causes leakage. The etch pit J1 is a specific etch pit and has a large depth. The etch pit J1 has a wide opening at an entrance end, and the etch pit J1 maintains a narrow width from a certain depth to a bottom. As shown in FIG. 5C and FIG. 5D, in a portion other than the leakage portion, an etch pit J2 is caused by the threading screw dislocation B (TSDB) that does not cause leakage. The etch pit J2 is a normal etch pit and has a small depth compared with the etch pit J1 shown in FIG. 5A and FIG. 5B. That is, threading screw dislocations include the threading screw dislocation A (TSDA) that causes the leakage, and the threading screw dislocation B (TSDB) that does not cause the leakage.

Further, according to the study by the inventors, the etch pit J1, which is caused by the threading screw dislocation A (TSDA), constantly has a shape shown in FIG. 5A and FIG. 5B. It is estimated that, a reason for a constant shape of the etch pit J1 may be a diffusion of aluminum (Al) ions, which are implanted into a surface portion of a substrate, around the dislocation caused by a distortion due to the dislocation, or may be a diffusion of point defects caused by the ion implantation.

Figure 6:
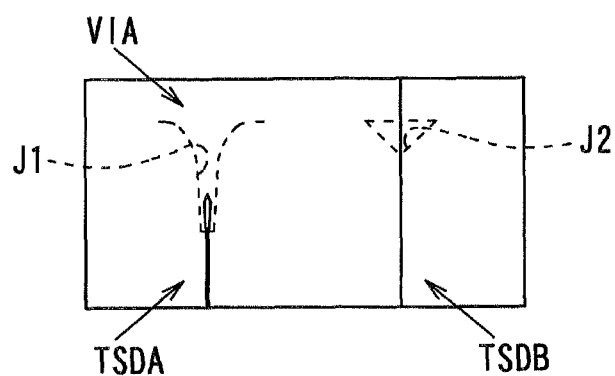
FIG. 6 is a cross-sectional view of an epitaxially grown substrate when an epitaxial growth is performed on the specific etch pit and the normal etch pit.

By use of the phenomenon that the etch pit J1 has a constant shape, the threading screw dislocations that cause the leakage may be reduced. For example, impurity ions, such as Al ions, are implanted into an SiC substrate, and then an activating annealing process is performed. Then wet etching with KOH solution is performed to form an etch pit. Then an epitaxial growth is performed on a surface of the SiC substrate to form an SiC growth layer. When the epitaxial growth is performed, since the etch pit J1, which is the specific etch pit, has a large depth, a portion near the bottom of the etch pit J1 can be controlled in such a manner that SiC is not grown in the portion near the bottom. That is, a void defect is formed at the portion near the bottom of the etch pit J1 by controlling growth conditions. Accordingly, the dislocation can be restricted from being transferred to the SiC growth layer. That is, as shown in FIG. 6, the threading screw dislocation that causes the leakage disappears with the epitaxial growth as shown by arrow VIA in FIG. 6.

Thus, an SiC growth layer without threading screw dislocations that cause leakage, can be obtained. Further, when semiconductor devices are made from the SiC growth layer, leakage is not caused. For example, when a MOSFET is made from the SiC growth layer, drain leakage is not caused.

First Embodiment

A first embodiment of the present disclosure will be described with reference to FIG. 1.

Figure 1A:
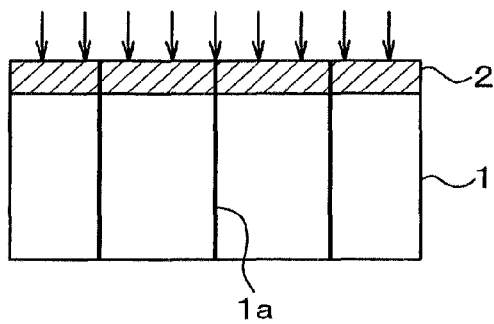
FIG. 1A to FIG. 1F are cross-sectional diagrams showing manufacturing processes of a manufacturing method of an SiC single crystal according to a first embodiment of the present disclosure.

As shown in FIG. 1A, an SiC substrate 1 having a Si face is used as an SiC single crystal substrate. For example, the SiC substrate 1 having the Si face may be prepared by cutting a bulk SiC single crystal, which is grown on a substrate having an offset angle from a c-plane, along the Si face. Alternatively, the SiC substrate 1 may also be prepared by growing an SiC layer epitaxially on a substrate made of the SiC single crystal.

The SiC substrate 1 prepared with any one of the above-described methods has an internally generated threading screw dislocation 1a. Then, an ion implantation layer 2 is formed by implanting Al ions into a surface portion of the SiC substrate 1, which has the threading screw dislocation 1a. During the ion implantation, an impurity concentration in the ion implantation layer 2 is controlled to within a range of $1 \times 10^{21}$ cm$^{-3}$ to $1 \times 10^{22}$ cm$^{-3}$. The ion implantation layer 2 may be formed to have any thickness. That is, once an estimated phenomenon, such as a diffusion of implanted Al ions around a dislocation caused by a distortion due to the dislocation, or a diffusion of point defects caused by the ion implantation, occurs, the ion implantation layer 2 may be formed to have any thickness without limitation.

After the ion implantation, as an activating annealing process, a heat treatment is performed to the SiC substrate 1 at a temperature of 1500° C. to 1700° C. so as to restore crystallinity that is destroyed by the ion implantation. A time for the heat treatment may be set to any value under the condition that the time is sufficient to restore the crystallinity that is destroyed by the ion implantation.

Figure 1D:
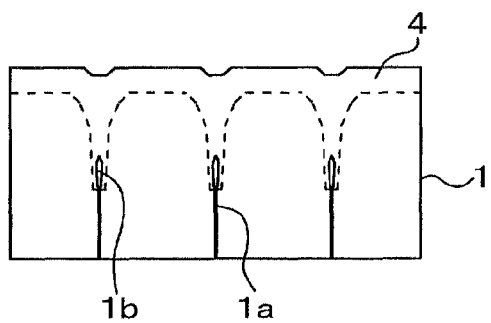
Figure 1B:
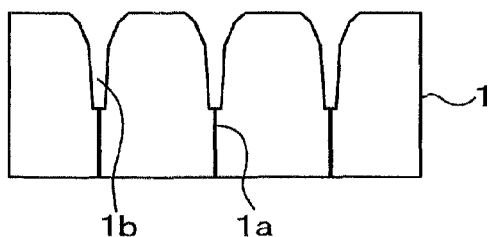

Next, as shown in FIG. 1B, in addition to the ion implantation layer 2, a defective portion in the SiC substrate 1 that is affected by the threading screw dislocation 1a and consequently has a destroyed crystallinity are etched by a chemical etching to form an etch pit 1b. For example, the chemical etching includes a wet etching using KOH solution and a dry etching, such as an inductively-coupled plasma (ICP) etching or a hydrogen etching. The etch pit 1b generated during the chemical etching penetrates deep into the SiC substrate 1, and has a wide opening at an entrance end. The etch pit 1b maintains a narrow width of the opening from a certain depth to a bottom. The etch pit 1b is a specific etch pit.

Figure 1E:
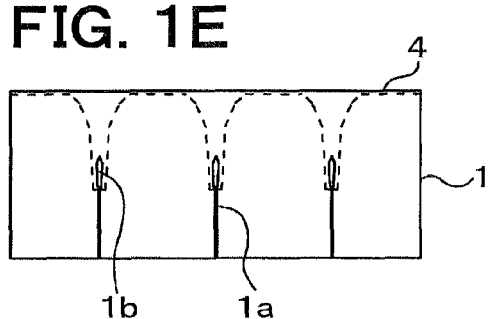
Figure 1C:
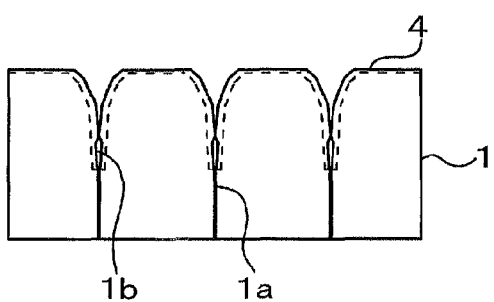

As shown in FIG. 1C, after the chemical etching, an epitaxial growth with chemical vapor deposition (CVD) method is performed on a surface of the SiC substrate 1 to form an SiC growth layer 4. The etch pit 1b is exposed on the surface of the SiC substrate 1. Growth conditions of the epitaxial growth are controlled so that the epitaxial growth is performed in such a manner that SiC grows faster on an inner wall than on the bottom, and portions of the SiC growth layer 4 grown on the inner wall join with each other before the portions of the SiC growth layer 4 grown on the inner wall join with a portion of the SiC growth layer 4 grown on the bottom. Specifically, the etch pit 1b is filled with the SiC in such a manner that a void defect remains at the bottom of the etch pit 1b. Thus, the dislocation can be restricted from being transferred to the SiC growth layer 4.

The growth conditions of the epitaxial growth, for example, may be set as followings. In a CVD apparatus, a temperature is set to 1650° C., a pressure is set to 870 kPa, which is equal to 600 Torr. Then mixed material gas, such as mixed gas of $SiH_4$ and $C_3H_8$, and carrier gas, such as $H_2$, are introduced together into the CVD apparatus. Under these growth conditions, a growth rate may be, for example, 2 μm per hour, and thereby the dislocation on the bottom of the etch pit 1b can be restricted from being transferred to the SiC growth layer 4 as described above.

As shown in FIG. 1D, when the epitaxial growth continues, the threading screw dislocation 1a is controlled not to transfer to the grown SiC growth layer 4. Thus, the SiC growth layer 4, which has a surface without the threading screw dislocation 1a, can be obtained.

As shown in FIG. 1E, in a case where the SiC growth layer 4 has an uneven surface due to a depression of the etch pit 1b, if necessary, the surface of the SiC growth layer 4 may be planarized by performing, for example, a chemical mechanical polishing (CMP) during the growth of the SiC growth layer 4.

Figure 1F:
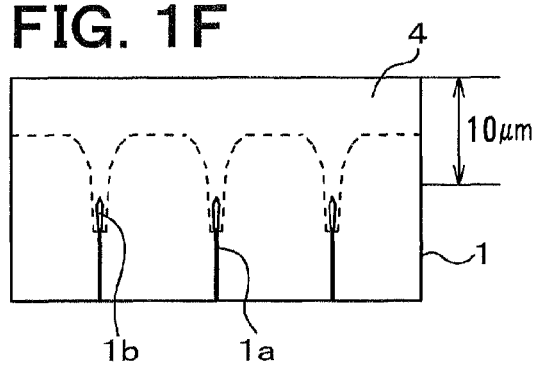

As shown in FIG. 1F, the SiC growth layer 4 is grown further to have a thickness of, for example, 10 μm from a forefront of the void defect to the surface of the SiC growth layer 4. Accordingly, an SiC semiconductor substrate, which is made of SiC single crystals and can be used for manufacturing devices, is obtained. When semiconductor devices, such as a vertical diode, in which current flows in a direction perpendicular to the SiC semiconductor substrate and a MOSFET, are made of the above-described SiC semiconductor substrate, the semiconductor devices in which leakage is restricted can be manufactured.

As described above, in the present embodiment, under a condition that a dislocation which causes leakage, such as drain leakage in a vertical MOSFET, is the threading screw dislocation, the implantation of Al ions, the activating annealing process and the etching with KOH solution are performed to form the substantially deep etch pit 1b at a leakage portion, which is corresponding to a portion at which the leakage is caused. Then on the inner wall of the etch pit 1b, the SiC growth layer 4 is epitaxially grown in such a manner that the portions of the SiC growth layer 4 grown on the inner wall of the etch pit 1b join with each other, and thereby the dislocation can be restricted from being transferred to the SiC growth layer 4.

Thus, the SiC growth layer 4, which has the surface without the threading screw dislocation 1a, can be obtained. Accordingly, the SiC single crystal in which a transfer of polymorphous crystals and dislocations is restricted and threading dislocations are reduced can be manufactured without forming a p-type layer and an n-type layer stacked in order.

Second Embodiment

A second embodiment of the present disclosure will be described. Because, in the present embodiment, the etch pit 1b is formed differently from the first embodiment and the other is similar to the first embodiment, only different part will be described.

As shown in FIG. 2A, an ion implantation layer 2 is formed in a surface portion of a prepared SiC substrate 1 by performing a process similar to a manufacturing process shown in FIG. 1A in the first embodiment. After ion implantation, heat treatment is performed so as to restore a crystallinity that is destroyed by the ion implantation. After the heat treatment, as shown in FIG. 2B, thermal oxidation is performed to form a thermal oxidization film 3 by oxidizing the ion implantation layer 2. During the thermal oxidation, a defective portion that is affected by the threading screw dislocation 1a and consequently has a destroyed crystallinity is oxidized together with the ion implantation layer 2.

As shown in FIG. 2C, after the thermal oxidization, the thermal oxidization film 3 is removed by performing a chemical etching, such as a hydrofluoric acid etching. That is, the thermal oxidization film 3, which is formed on the defective portion, is also removed. Thus, the etch pit 1b is generated at a portion where the threading screw dislocation is generated. The etch pit 1b penetrates deep into the SiC substrate 1, and has a wide opening at an entrance end. The etch pit 1b maintains a narrow width of the opening from a certain depth to a bottom. The etch pit 1b is a specific etch pit.

After the hydrofluoric acid etching, processes shown in FIG. 2D to FIG. 2G, which are similar to the process shown in FIG. 1C to FIG. 1F in the first embodiment, are performed so that an SiC growth layer 4, which has a surface without the threading screw dislocation 1a, can be grown. Accordingly, an SiC semiconductor substrate, which is made of SiC single crystals and can be used for manufacturing devices, is obtained.

As described above, the etch pit 1b may also be generated by performing the thermal oxidation to form the thermal oxidization film 3 on the defective portion, and then removing the thermal oxidization film 3 by performing, for example, the hydrofluoric acid etching. The manufacturing method according to the second embodiment provides advantages similar to the advantages provided by the manufacturing method according to the first embodiment.

Third Embodiment

A third embodiment of the present disclosure will be described. Because, in the present embodiment, after an SIC growth layer 4 is grown to have no threading screw dislocation 1a on a surface of the SiC growth layer 4, a bulk growth is performed instead of continuing an epitaxial growth. Since the other is similar to the first embodiment, only different part will be described.

As shown in FIG. 3A to FIG. 3E, processes similar to the process shown in FIG. 1A to FIG. 1E in the first embodiment, are performed. Similar to the first embodiment, if necessary, the surface of the SiC growth layer 4 may be planarized. By performing the processes shown in FIG. 3A to FIG. 3E, the SiC growth layer 4, which has a surface without the threading screw dislocation 1a, can be obtained.

Figure 3A:
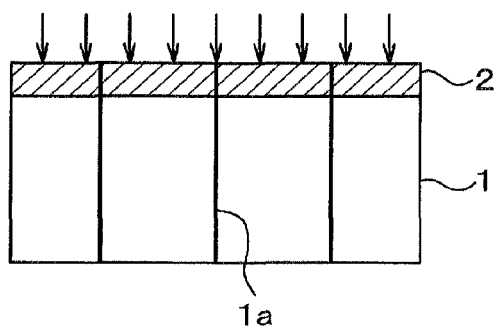
FIG. 3A to FIG. 3H are cross-sectional diagrams showing manufacturing processes of a manufacturing method of an SiC single crystal according to a third embodiment of the present disclosure.
Figure 3B:
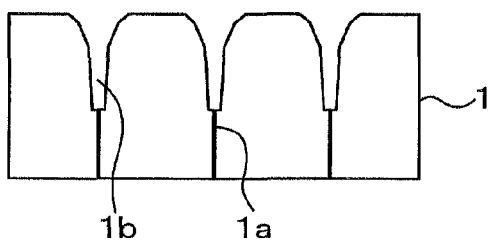
Figure 3C:
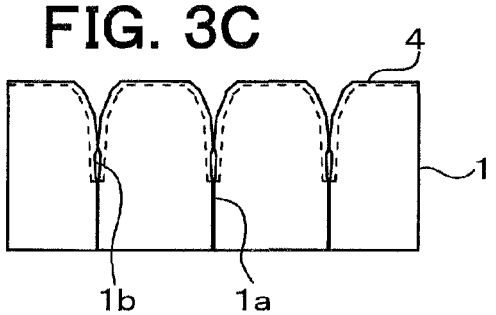
Figure 3D:
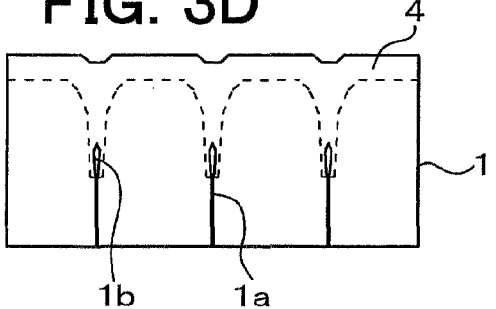
Figure 3E:
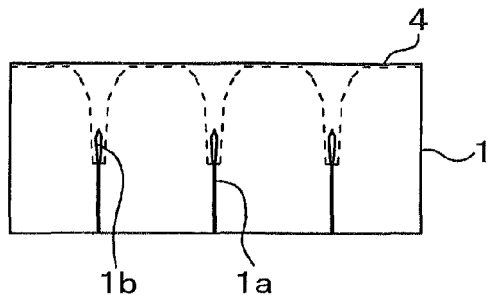
Figure 3F:
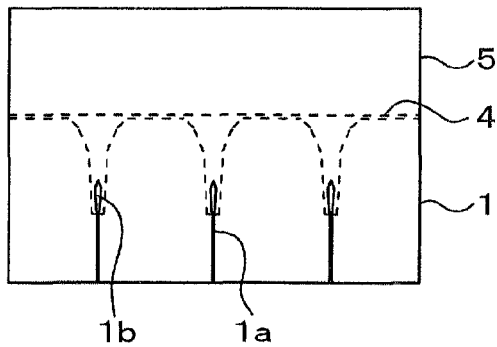

Next, as shown in FIG. 3F, an SiC substrate 1 on which the SiC growth layer 4 is formed is disposed in a crucible or in a growth chamber. The crucible is used to grow a bulk SiC single crystal with a sublimation recrystallization method. The growth chamber is used to grow a bulk SiC single crystal with a liquid phase method or a vapor phase method. Then an SiC single crystal 5 is grown on the SiC growth layer 4. Any growth method known as the sublimation recrystallization method, the liquid phase method or the vapor phase method can be used to grow the SiC single crystal 5.

Figure 3G:
Figure 3H:
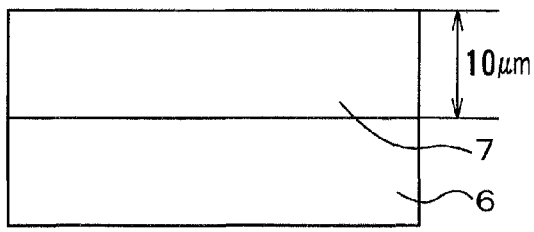

After the bulk growth, as shown in FIG. 3G, the bulk SiC single crystal 5 is cut out in a predetermined plane direction to obtain an SiC single crystal substrate 6. Then, as shown in FIG. 3H, the SiC single crystal substrate 6 is grown epitaxially to form an SiC growth layer 7 on a surface of the SiC single crystal substrate 6. The SiC growth layer 7 may be grown to have a thickness of, for example, 10 µm by, for example, disposing the SiC single crystal substrate 6 in the CVD apparatus. Thus, an SiC semiconductor substrate, which is made of SiC single crystals and can be used for manufacturing devices, is obtained. When semiconductor devices, such as a vertical diode in which current flows in a direction perpendicular to the substrate and a MOSFET, are made of the above-described SiC semiconductor substrate, the semiconductor devices in which leakage is restricted can be manufactured.

As described above, in the forgoing embodiments, the SiC substrate 1 without the threading screw dislocation 1a on the surface of the SiC growth layer 4, is used as the SiC semiconductor substrate to manufacture devices. Alternatively, as described in the present embodiment, the SiC semiconductor substrate to manufacture devices may also be obtained by growing the bulk SiC single crystal 5 on the surface of the SiC growth layer 4, then cutting out the SiC single crystal substrate 6 from the bulk SiC single crystal 5 in the predetermined plane direction and then growing the SiC growth layer 7 on the surface of the cutout SiC single crystal substrate 6. The manufacturing method according to the third embodiment provides advantages similar to the advantages provided by the manufacturing method according to the first embodiment.

Fourth Embodiment

A fourth embodiment of the present disclosure will be described. In the present embodiment, the SiC substrate 1, which has no threading screw dislocation is on the surface of the SiC growth layer 4, is grown with the method described in the second embodiment. Then, similar to the third embodiment, the bulk growth is performed instead of continuing the epitaxial growth. Since the processes prior to the bulk growth are similar to the second embodiment, only different part will be described.

The processes shown in FIG. 4A to FIG. 4F, which are similar to the process shown in FIG. 2A to FIG. 2F in the second embodiment, are performed. Similar to the second embodiment, if necessary, the surface of the SiC growth layer 4 may be planarized. By performing processes shown in FIG. 4A to FIG. 4F, the SiC growth layer 4 without the threading screw dislocation 1a on the surface, is obtained.

Figure 4A:
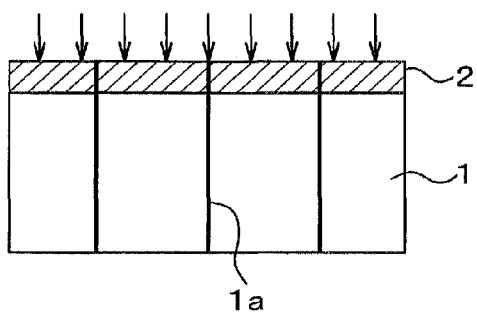
FIG. 4A to FIG. 4I are cross-sectional diagrams showing manufacturing processes of a manufacturing method of an SiC single crystal according to a fourth embodiment of the present disclosure.
Figure 4B:
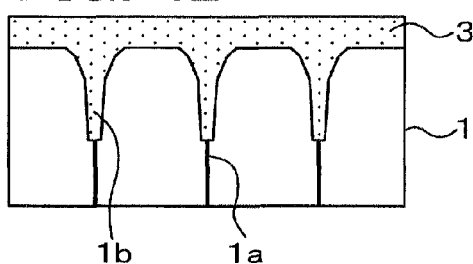
Figure 4C:
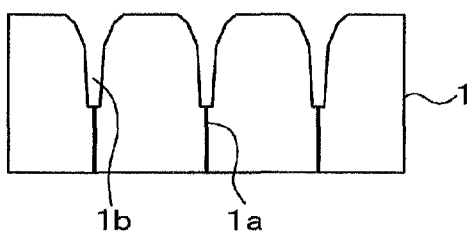
Figure 4D:
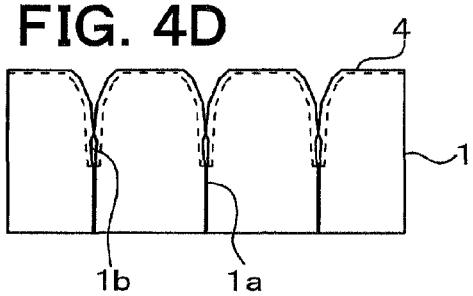
Figure 4E:
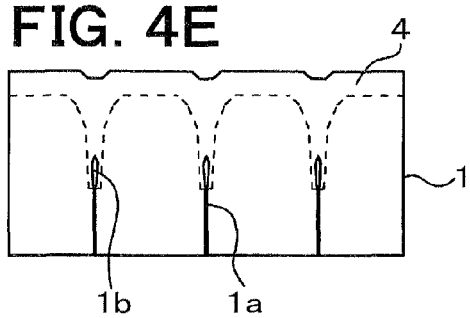
Figure 4F:
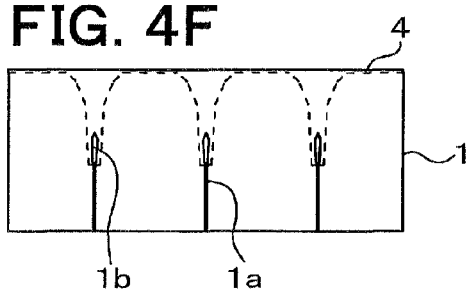
Figure 4G:
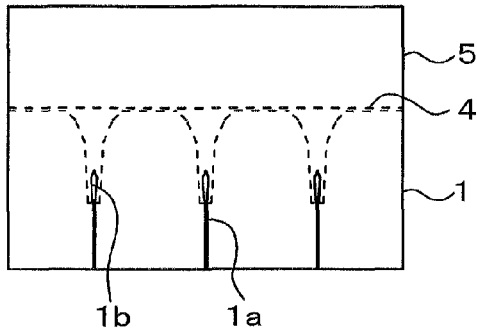

Next, as shown in FIG. 4G, an SiC single crystal 5 is grown on the surface of the SIC growth layer 4 similarly to the process shown in FIG. 3F. Any growth method known as the sublimation recrystallization method, the liquid phase method or the vapor phase method can be used to grow the SiC single crystal 5.

Figure 4H:
Figure 4I:
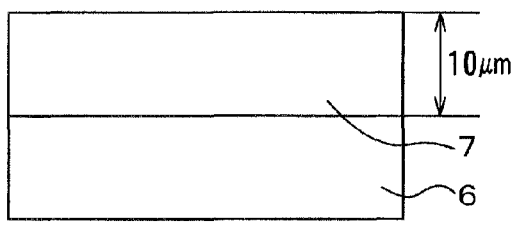

Next, as shown in FIG. 4H, an SiC single crystal substrate 6 is cut out from the bulk SiC single crystal 5 in a predetermined plane direction. This process is similar to the process shown in FIG. 3G. Next, as shown in FIG. 4I, the cutout SiC single crystal substrate 6 is grown epitaxially to form an SiC growth layer 7 on a surface of the SiC single crystal substrate 6. This process is similar to the process shown in FIG. 3H. The SiC growth layer 7 may be grown to have a thickness of, for example, 10 µm.

Thus, an SiC semiconductor substrate, which is made of SiC single crystals and can be used for manufacturing devices, is obtained. When semiconductor devices, such as a vertical diode in which current flows in a direction perpendicular to the SiC semiconductor substrate and a MOSFET, are made of the SiC semiconductor substrate, the semiconductor devices in which leakage is restricted can be manufactured.

As described above, similar to the second embodiment, the bulk SiC semiconductor substrate may also be obtained in a case where the etch pit 1b is formed by performing the thermal oxidization to form the thermal oxidization film 3 on a defective portion that is affected by the threading screw dislocation 1a and consequently has a destroyed crystallinity and on the ion implantation layer 2, and then removing the thermal oxidization film 3 by performing, for example, the hydrofluoric acid etching. The manufacturing method according to the fourth embodiment provides advantages similar to the advantages provided by the manufacturing method according to the second embodiment.

Other Embodiments

In each of the forgoing embodiments, the surface of the SiC substrate 1 is the Si face. The Si face is an example of the plane direction, which is applied to the wet etching using KOH solution or dry etching, such as ICP etching and hydrogen etching. When other method is used as the chemical etching method, any face can be used.

In each of the forgoing embodiments, Al ions are used to form the ion implantation layer 2. Alternatively, any ions other than Al ions may be used to form the ion implantation layer 2. That is, once an estimated phenomenon, such as a diffusion of implanted Al ions around dislocation caused by a distortion due to the dislocation, or a diffusion of point defects caused by the ion implantation, occurs, any ions, such as nitrogen ions, other than the Al ions, may be used to form the ion implantation layer 2.

Further, in each of the forgoing embodiments, the epitaxial growth is performed with the vapor phase method using CVD apparatus. Alternatively, methods other than the CVD method may also be used for the epitaxial growth.

While the disclosure has been described with reference to preferred embodiments thereof, it is to be understood that the disclosure is not limited to the preferred embodiments and constructions. The disclosure is intended to cover various modification and equivalent arrangements. In addition, while the various combinations and configurations, which are preferred, other combinations and configurations, including more, less or only a single element, are also within the spirit and scope of the disclosure.

What is claimed is:

1. A manufacturing method of a silicon carbide single crystal comprising:
   preparing a silicon carbide substrate;
   implanting ions into a surface portion of the silicon carbide substrate to form an ion implantation layer;
   activating the ions implanted into the surface portion of the silicon carbide substrate by annealing;
   chemically etching the surface portion of the silicon carbide substrate to form an etch pit that is caused by a threading screw dislocation included in the silicon carbide substrate; and
   performing an epitaxial growth of silicon carbide to form a silicon carbide growth layer on a surface of the silicon carbide substrate including an inner wall of the etch pit in such a manner that portions of the silicon carbide growth layer grown on the inner wall of the etch pit join with each other.

2. The manufacturing method according to claim 1, wherein the epitaxial growth is performed in such a manner that a void defect remains on a bottom of the etch pit.

3. The manufacturing method according to claim 1, wherein the implanting ions to form the ion implantation layer includes implanting aluminum ions.

4. The manufacturing method according to claim 1, wherein an impurity concentration of the ion implantation layer is within a range of $1 \times 10^{21}$ cm$^{-3}$ to $1 \times 10^{22}$ cm$^{-3}$.

5. The manufacturing method according to claim 1, wherein the surface of the silicon carbide substrate is a Si face.

6. The manufacturing method according to claim 1, wherein the surface of the silicon carbide substrate is a Si face and the chemical etching is performed with a KOH etching, an ICP dry etching or a hydrogen dry etching.

7. The manufacturing method according to claim 1, wherein the performing the epitaxial growth includes
   planarizing a surface of the silicon carbide growth layer during the epitaxial growth, and
   continuing the epitaxial growth on a planarized surface of the silicon carbide growth layer.

8. The manufacturing method according to claim 1, further comprising:
   growing a bulk silicon carbide single crystal on the surface of the silicon carbide growth layer after performing the epitaxial growth of the silicon carbide growth layer;
   forming a silicon carbide single crystal substrate by cutting out the bulk silicon carbide single crystal; and
   growing a silicon carbide growth layer on a surface of the silicon carbide single crystal substrate.

9. A manufacturing method of a silicon carbide semiconductor device comprising:
   forming a silicon carbide semiconductor substrate made of silicon carbide single crystal with the manufacturing method according to claim 1, and
   manufacturing a MOSFET or a diode, in which current flows in a direction perpendicular to the silicon carbide semiconductor substrate, with the silicon carbide semiconductor substrate.

10. A manufacturing method of an SiC single crystal comprising:
    preparing a silicon carbide substrate;
    implanting ions into a surface portion of the silicon carbide substrate to form an ion implantation layer;
    activating the ions implanted into the surface portion of the silicon carbide substrate by annealing;
    thermally oxidizing the ion implantation layer and a defective portion in the silicon carbide substrate to form a thermal oxidization film, the defective portion having a destroyed crystallinity due to a threading screw dislocation included in the silicon carbide substrate;
    chemically etching the surface portion of the silicon carbide substrate to remove the thermal oxidization film and to form an etch pit that is caused by a threading screw dislocation; and
    performing an epitaxial growth of silicon carbide to form a silicon carbide growth layer on a surface of the silicon carbide substrate including an inner wall of the etch pit in such a manner that portions of the silicon carbide growth layer grown on the inner wall of the etch pit join with each other.

11. The manufacturing method according to claim 10, wherein the epitaxial growth is performed in such a manner that a void defect remains on a bottom of the etch pit.

12. The manufacturing method according to claim 10, wherein the implanting ions to form the ion implantation layer includes implanting aluminum ions.

13. The manufacturing method according to claim 10, wherein an impurity concentration of the ion implantation layer is within a range of $1 \times 10^{21}$ cm$^{-3}$ to $1 \times 10^{22}$ cm$^{-3}$.

14. The manufacturing method according to claim 10, wherein the surface of the silicon carbide substrate is a Si face.

15. The manufacturing method according to claim 10, wherein the surface of the silicon carbide substrate is a Si face and the chemical etching is performed with a KOH etching, an ICP dry etching or a hydrogen dry etching.

16. The manufacturing method according to claim 10, wherein the performing the epitaxial growth includes
    planarizing a surface of the silicon carbide growth layer during the epitaxial growth, and
    continuing the epitaxial growth on a planarized surface of the silicon carbide growth layer.

17. The manufacturing method according to claim 10, further comprising:
    growing a bulk silicon carbide single crystal on the surface of the silicon carbide growth layer after performing the epitaxial growth of the silicon carbide growth layer;
    forming a silicon carbide single crystal substrate by cutting out the bulk silicon carbide single crystal; and
    growing a silicon carbide growth layer on a surface of the silicon carbide single crystal substrate.

18. A manufacturing method of a silicon carbide semiconductor device comprising:
    forming a silicon carbide semiconductor substrate made of silicon carbide single crystal with the manufacturing method according to claim 10, and
    manufacturing a MOSFET or a diode, in which current flows in a direction perpendicular to the silicon carbide semiconductor substrate, with the silicon carbide semiconductor substrate.

* * * * *